(12) United States Patent
Naito

(10) Patent No.: US 6,939,745 B2
(45) Date of Patent: Sep. 6, 2005

(54) METHOD OF PRODUCING TAB TAPE CARRIER

(75) Inventor: Toshiki Naito, Osaka (JP)

(73) Assignee: Nitto Denko Corporation, Osaka (JP)

(*) Notice: Subject to any disclaimer, the term of this patent is extended or adjusted under 35 U.S.C. 154(b) by 0 days.

(21) Appl. No.: 10/839,141

(22) Filed: May 6, 2004

(65) Prior Publication Data
US 2004/0224436 A1 Nov. 11, 2004

(30) Foreign Application Priority Data
May 8, 2003 (JP) .................................... 2003-130806

(51) Int. Cl.[7] ............................................. H01L 21/44
(52) U.S. Cl. ........................ 438/125; 438/110; 438/107
(58) Field of Search ................................ 438/125, 110, 438/107

(56) References Cited

U.S. PATENT DOCUMENTS 5,837,154 A * 11/1998 Okabe et al. ................ 216/14
6,740,966 B2 * 5/2004 Nakamura ................... 257/701

FOREIGN PATENT DOCUMENTS

JP  2000-133891  5/2000

* cited by examiner

*Primary Examiner*—Luan Thai
(74) *Attorney, Agent, or Firm*—Jean C. Edwards, Esq.; Dickinson Wright PLLC

(57) ABSTRACT

A method of producing a TAB tape carrier that can produce a TAB tape carrier in such a way as to prevent undulation at a split end surface thereof and tear of circuit pattern thereat, thereby producing the TAB tape carrier of high reliability with increased efficiency. In the method, an insulating layer is formed on an elongate metal supporting layer by application of resin solution to the metal supporting layer and by drying, first. Then, a plurality of lines of wiring patterns are formed on the insulating layer in a semi-additive process. Thereafter, slit grooves are formed in the metal supporting layer in spaces between adjacent lines of wiring patterns. Then, the insulating layer is split along the slit grooves to divide the continuous sheet into individual strips, thereby producing the TAB tape carriers.

2 Claims, 4 Drawing Sheets

(a)

(b)

METHOD OF PRODUCING TAB TAPE CARRIER

BACKGROUND OF THE INVENTION

1. Field of the Invention

This application claims priority from Japanese Patent Application No. 2003-130806, filed May 8, 2003, the entire contents of which are herein incorporated by reference to the extent allowed by law.

The present invention relates to a method of producing a TAB tape carrier and, more particularly, to a method of producing a TAB tape carrier used for mounting an electronic component by the TAB method.

2. Description of the Prior Art

The TAB tape carrier is widely used for mounting the electronic device comprising a semiconductor device and the like by the TAB (tape automated bonding) method. The TAB tape carrier usually has a plurality of wiring patterns designed for mounting the electronic device which are spaced apart from each other at a predetermined space along a longitudinal direction of the TAB tape carrier.

The TAB tape carrier is usually produced in the following steps. First, a wide elongate board comprising a metal supporting layer and an insulating layer laminated on the metal supporting layer is prepared. Then, after wiring patterns of conductor layer are formed in lines on the insulating layer of the elongate board, they are slit into individual lines of wiring patterns in the final stage.

Japanese Patent No. 3356076 proposes a method of producing a flexible printed wiring board, which comprises the steps: (a) after a film of polyimide varnish is formed on a sheet conductor layer by casting in a roll-to-roll process, the polyimide varnish is cured, thereby forming an insulating layer of the polyimide film, (b) a plurality of lines of wired circuits, each having a plurality of wired circuits, are formed on the sheet conductor layer by etching in the roll-to-roll process, while also, slit grooves are formed between adjacent lines of wired circuits by etching in the roll-to-roll process to expose the polyimide film from the slit grooves, (c) a coverlay is formed over the conductor layer including the wired circuits in such a manner as not to cover the slit grooves in the roll-to-roll process, and (d) the plurality of lines of wired circuits are divided into each individual line of wired circuits along the slit grooves by use of a nip roll in the roll-to-roll process.

In this method of JP Patent No. 3356076 cited above, since after a film of polyimide varnish is formed on the sheet conductor layer by casting, the polyimide varnish is cured, thereby forming an insulating layer of the polyimide film, the conductor layer is given a heat history of 300° C. or more when the polyimide varnish is cured.

The conductor layer is usually formed of copper foil having good electric properties, inexpensiveness and ready availability. The copper foil is however annealed at the temperature at which the polyimide varnish is cured, so that it is decreased in yield point, so that the plastic deformation is easily incurred by an external force.

Due to this, when the conductor layer as was given the heat history is slit to split the lines of wired circuits into each individual line of wired circuits along the slit grooves by use of the nip roll, it is undulated at the split end surfaces thereof and is sometimes torn thereat. This problem becomes outstanding particularly in the application to a circuit requiring a fine wiring pattern such as COF (chip on film), because the conductor layer used has a very small thickness.

Also, Japanese Patent No. 3356076 cited above describes that a carrier sheet is formed on an insulating layer at the opposite side to the conductor layer via adhesive. However, the use of the adhesive provides limited heat-resistance temperature and limited chemical resistance caused by the adhesive properties and also provides the disadvantage that an adhesive flash is produced at an end surface of the insulating layer when split or the adhesive remaining on the carrier sheet after split causes deterioration in reliability of the wired circuit.

SUMMARY OF THE INVENTION

It is the object of the invention to provide a method of producing TAB tape carrier that can produce TAB tape carrier in such a way as to prevent undulation at a split end surface thereof and tear of circuit pattern thereat, thereby producing the TAB tape carrier of high reliability with increased efficiency.

The present invention provides a novel method of producing a TAB tape carrier comprising the step of forming an insulating layer directly on an elongate metal supporting layer, the step of forming a plurality of lines of wiring patterns directly on the insulating layer, the step of forming a slit groove in the metal supporting layer in a space between adjacent lines of the wiring patterns, and the step of splitting the insulating layer along the split groove to divide the plurality of lines of wiring patterns into each individual line of wiring patterns.

In the method of producing the TAB tape carrier, it is preferable that the metal supporting layer is a stainless foil.

According to the method of producing the TAB tape carrier of the present invention, since the insulating layer is split along the slit groove formed in the metal supporting layer to divide the plurality of lines of wiring patterns into each individual line of wiring patterns, the TAB tape carrier produced in this method can be prevented from being undulated at the split end surfaces and the circuit pattern can be prevented from being torn thereat even when the circuit pattern is formed to be small in thickness. Also, since the insulating layer is formed directly on the metal supporting layer and the wiring pattern is formed directly on the insulating layer, without using any adhesive, the TAB tape carrier is not bound by the limitations on heat-resistance temperature and on chemical resistance caused by the adhesive. This can allow the TAB tape carrier to have sufficient heat resistance in the production process or in the mounting process of the electronic devices, thus preventing deterioration in reliability caused by the adhesive. Thus, the method of producing the TAB tape carrier of the present invention can be effectively used, for example, in the application to a circuit requiring a thin film and a fine wiring pattern such as COF (chip on film).

Figure 1:
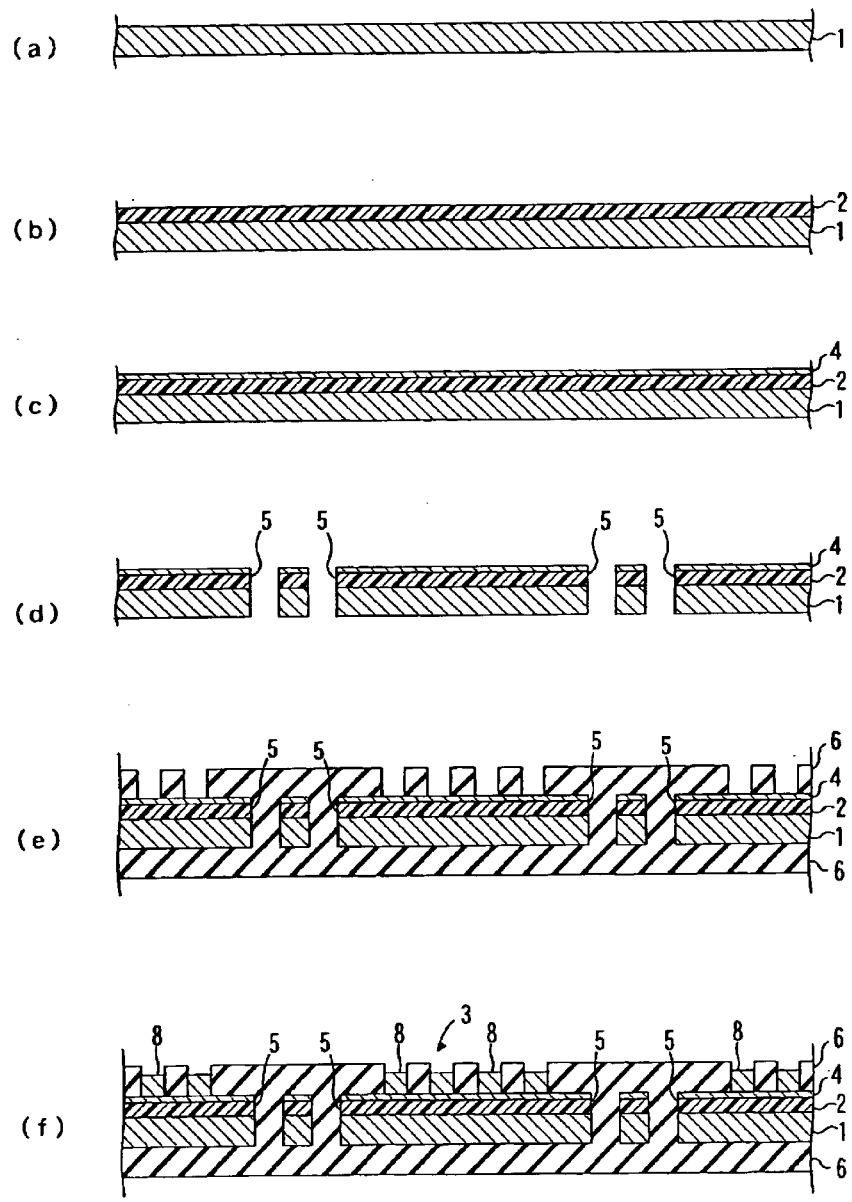
FIG. 1 shows the production processes showing an embodiment of a method of producing a TAB tape carrier of the present invention.
Figure 2:
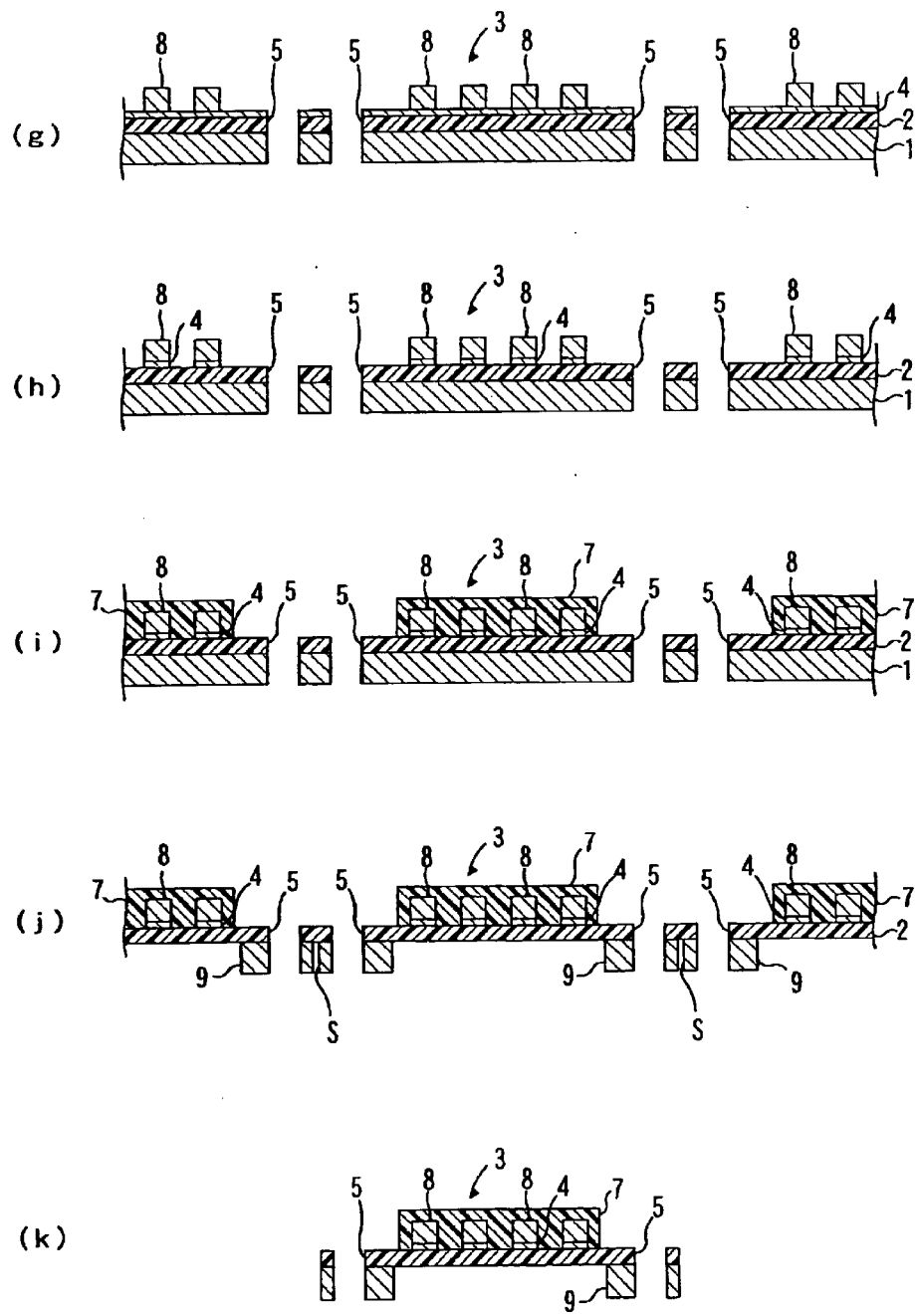
Figure 3:
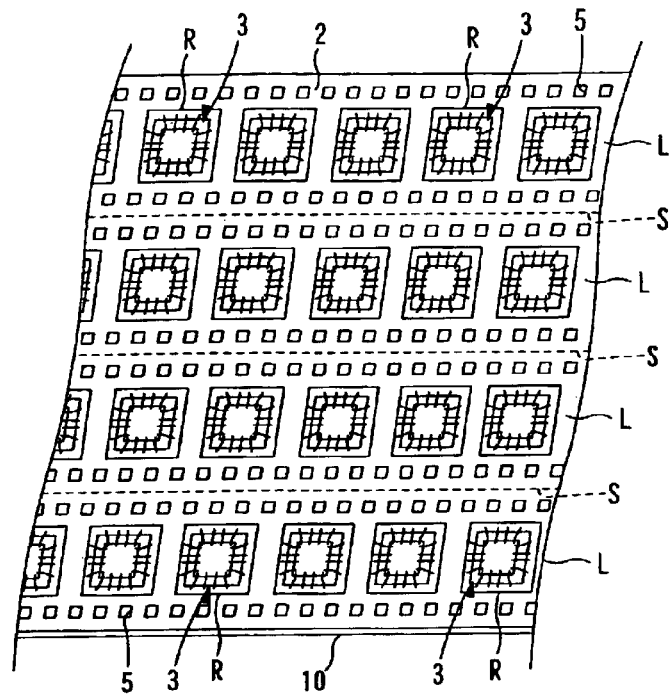
Figure 3:
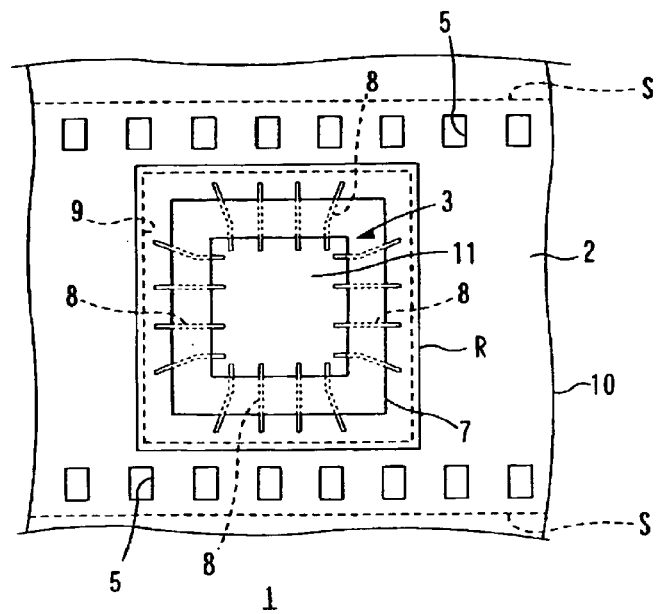
Figure 4:
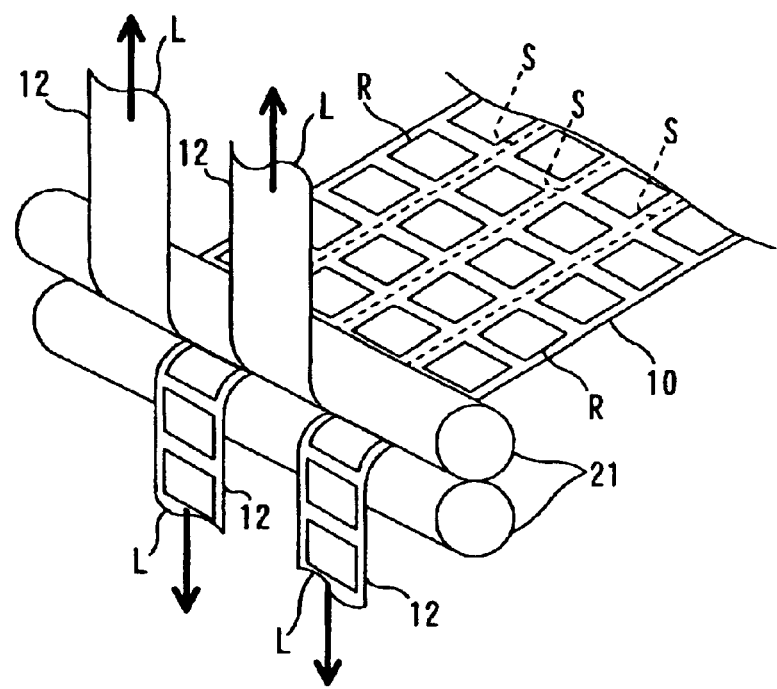

(a) shows the step of preparing an elongate metal supporting layer;

(b) shows the step of forming an insulating layer directly on the elongate metal supporting layer;

(c) shows the step of forming a thin conductor film serving as a ground layer on the entire surface of the insulating layer;

(d) shows the step of forming feeding holes to extend through the metal supporting layer, the insulating layer, and the ground layer in the thickness direction thereof;

(e) shows the step of forming a plating resist having a reversal pattern to a plurality of lines of wiring patterns; and (f) shows the step of forming the plurality of lines of wiring patterns by electrolytic plating on a portion of the ground layer on which no plating resist is formed, FIG. 2 shows the production processes next to the production processes of FIG. 1, showing the embodiment of the method of producing the TAB tape carrier of the present invention:

(g) shows the step of removing the plating resist;

(h) shows the step of removing the portion of the ground layer in which the plating resist was formed;

(i) shows the step of forming a solder resist to cover intermediate portions of the wirings of the respective wiring patterns;

(j) shows the step of forming an opening in an area of the metal supporting layer corresponding to a mounting region and also forming slit grooves between adjacent wiring patterns formed in lines; and (k) shows the step of splitting the insulating layer along the slit grooves to divide the continuous sheet into each individual line of wiring patterns to thereby produce the TAB tape carrier, FIG. 3 shows the production processes of the method of producing the TAB tape carrier shown in FIG. 1, (a) shows a perspective view of the continuous sheet; and (b) shows a plan view of a principal part of the continuous sheet shown in FIG. 3(a), and FIG. 4 is an explanatory view showing an embodiment of the process of splitting the insulating layer along the slit grooves in the method of producing the TAB tape carrier shown in FIG. 1.

DETAILED DESCRIPTION OF THE PREFERRED EMBODIMENTS

Referring to FIGS. 1 and 2 showing the production processes showing an embodiment of a method of producing a TAB tape carrier of the present invention, an embodiment of the method of producing the TAB tape carrier of the present invention will be described below.

In this method, an elongate metal supporting layer 1 is prepared, first, as shown in FIG. 1(a).

The material of the metal supporting layer 1 is not limited to any particular one. For example, a stainless foil, a copper foil, and a nickel foil can be cited as the material of the metal supporting layer 1. The stainless foil is preferably used as the metal supporting layer 1 in that it has a high elastic modulus, can be split well when split, as mentioned later, and its mechanical properties are not changed substantially by the heat history. A variety of stainless steels standardized by AISI (American Iron and Steel Institute) can be used for the stainless foil, including, for example, SUS301, SUS304, SUS305, SUS309, SUS310, SUS316, SUS317, SUS321, and SUS347.

The metal supporting layer 1 having a thickness of e.g. 3–100 $\mu$m, preferably 5–30 $\mu$m, or further preferably 8–20 $\mu$m, is preferably used. Also, the metal supporting layer 1 is in the form of an elongate tape having a width of in the order of 100–1,000 mm, or preferably 150–400 mm.

Sequentially, an insulating layer 2 is formed directly on the elongate metal supporting layer 1, as shown in FIG. 1(b).

No particular limitation is imposed on the insulating material of the insulating layer 2. The insulating materials that may be used include, for example, synthetic resins, such as polyimide resin, acrylic resin, polyether nitrile resin, polyether sulfonic resin, polyethylene terephthalate resin, polyethylene naphthalate resin and polyvinyl chloride resin. Polyimide resin is preferably used.

The insulating layer 2 is formed directly on the metal supporting layer 1, for example, by the process that resin solution is applied to the surface of the metal supporting layer 1 and, after being dried, is cured by heating. The resin solution can be prepared by dissolving the resin cited above in an organic solvent and the like. For example, solution of polyamide acid resin which is a precursor of polyimide resin can be used as the resin solution. The resin solution can be applied to the metal supporting layer 1 by a known coating method, such as a doctor blade method and a spin coat method. Then, after the resin solution is dried by heating properly, it is cured by heating at 200–600° C., whereby the insulating layer 2 of a flexible resin film is formed directly on the metal supporting layer 1.

The insulating layer 2 can also be formed in the form of a predetermined pattern, for example, by the process that after solution of photosensitive resin, such as photosensitive polyamide acid resin, is applied to the surface of the metal supporting layer 1 and then is exposed to light and developed.

Further, the insulating layer 2 can be formed by the process that a film of B stage resin as is previously formed is bonded to the surface of the metal supporting layer 1 by an application of heat and pressure.

The insulating layer 2 thus formed has a thickness of e.g. 3–50 $\mu$m, or preferably 5–30 $\mu$m.

Sequentially, a plurality of wiring patterns 3 are formed in lines directly on the insulating layer 2. The conductive materials used for the wiring pattern 3 include, for example, copper, nickel, gold, solder or alloys thereof. Copper is preferably used. The wiring pattern 3 can be formed on a surface of the insulating layer 2 by a known patterning process, such as a subtractive process, an additive process, or a semi-additive process. No particular limitation is imposed on the process for forming the wiring pattern 3.

In the subtractive process, a conductor layer is laminated on the entire surface of the insulating layer 2, first. Then, an etching resist having a pattern corresponding to the lines of circuit patterns 3 is formed on the conductor layer, so that the conductor layer is etched, with the etching resist as a resist. Thereafter, the etching resist is removed.

In the additive process, a plating resist with a pattern reverse to the lines of circuit patterns 3 (reversal pattern) is formed on the insulating layer 2. Sequentially, the wiring pattern 3 is formed by electroless plating on a surface of the insulating layer 2 where the plating resist is not formed. Thereafter, the plating resist is removed.

In the semi-additive process, a thin conductor film serving as a ground layer is formed on the insulating layer 2, first. Then, a plating resist with a pattern (reversal pattern) reverse to the lines of circuit patterns 3 is formed on the ground layer. Sequentially, the wiring pattern 3 is formed by electrolytic plating on a surface of the ground layer where the plating resist is not formed. Then, after the plating resist is removed, the plating resist and the ground layer at locations thereof where the plating resist was laminated are removed.

Among these patterning processes, the semi-additive process is preferably used, as shown in FIG. 1(c) to FIG. 2(h).

Specifically, in the semi-additive process, a thin conductor film serving as the ground layer 4 is formed on the entire surface of the insulating layer 2, first, as shown in FIG. 1(c). Vacuum deposition or sputtering, in particular, is preferably used for forming the ground layer 4. Also, chromium and copper are preferably used for the conductor film serving as the ground layer 4. To be more specific, it is preferable that for example a thin chromium film and a thin copper film are formed on the entire surface of the insulating layer 2 sequentially by the sputtering. Also, it is preferable that when forming the ground layer 4, the thin chromium film and the thin copper film are set to have thicknesses of 100–600 Å and 500–2,000 Å, respectively Then, a plurality of feed holes 5 are formed at locations corresponding to both widthwise ends of each of the lines of wiring patterns 3, to extend through the metal supporting layer 1, the insulating layer 2 and the ground layer 4 in the thickness direction thereof, as shown in FIG. 1(d). These feed holes 5 are longitudinally spaced at a predetermined distance (See FIG. 3). The feed holes 5 can be formed by a known process, such as drilling, a laser process, punching, and etching. The punching is preferably used for forming the feed holes 5.

Then, a plating resist 6 having a pattern (reversal pattern) reverse to the lines of wiring patterns 3 is formed on the ground layer 4, as shown in FIG. 1(e). The plating resist 6 is formed as a resist pattern having a reversal pattern to the wiring pattern 3 in each of the lines of wiring patterns 3 by a known process using e.g. liquid photoresist and dry film photoresist. Also, the plating resist 6 is formed on the entire surface of the metal supporting layer 1 as well.

Sequentially, the lines of wiring patterns 3 are formed on the ground layer 4 at locations thereof where the plating resist 6 is not formed, by electrolytic plating, as shown in FIG. 1(f). The electrolytic copper plating is preferably used.

Then, the plating resist 6 is removed by a known etching process, such as a chemical etching (wet etching) or by peeling, as shown in FIG. 2(g). Thereafter, the ground layer 4 at the locations thereof where the plating resist 6 was formed is also removed by a known etching process such as the chemical etching, as shown in FIG. 2(h).

As a result of this, the wiring patterns 3 are formed in lines on the insulating layer 2. In other words, the wiring patterns 3 are formed in generally rectangular mounting regions R for mounting the electronic devices, respectively, as shown in FIG. 3(a). Specifically, the wiring patterns 3 are formed in their respective mounting regions R which are arranged in each of the lines L of wiring patterns 3 which are arranged adjacent to each other in a widthwise direction of the elongate metal supporting layer 1 (in a direction orthogonal to the longitudinal direction thereof) and are spaced apart from each other at a predetermined distance in the longitudinal direction of the metal supporting layer 1.

The wiring patterns 3 thus formed have a thickness of e.g. 3–50 μm, or preferably 5–25 μm.

Sequentially, a solder resist 7 is formed to cover intermediate parts of the wirings 8 of the wiring patterns 3, as shown in FIG. 2(i) (Cf. FIG. 3(b)). Then, a nickel plated layer and a gold plated layer (not shown) are formed on the wirings 8 at the both ends exposed from the solder resist 7.

The solder resist 7 can be formed in the form of a predetermined pattern by a known method, such as a photographic method or a printing method, using a photosensitive solder resist, for example. Also, the nickel plated layer and the gold plated layer can be formed, for example, by the electrolytic nickel plating and the electrolytic gold plating, respectively.

The solder resist 7 thus formed has a thickness of e.g. 5–30 μm, or preferably 8–20 μm.

Then, openings 9 are formed in the metal supporting layer 1 at portions thereof corresponding to the mounting regions R, as shown in FIG. 2(j) (Cf. FIG. 3(b)), and also slit grooves S are formed between the adjacent lines L where the wiring patterns 3 are formed (Cf. FIG. 3(a)).

The openings 9 and the slit grooves S can be formed in the metal supporting layer 1, for example, by simultaneously opening the metal supporting layer 1 at its portions corresponding to the mounting regions R as well as its portions corresponding to spaces defined between the adjacent lines L of the wiring patterns 3 extending along the longitudinal direction of the metal supporting layer 1 by wet-etching (chemical etching). The etching can be done in the following manner. The entire surface of the metal supporting layer 1 but its portions corresponding to the mounting regions R and its portions corresponding to the spaces defined between the adjacent lines L of the wiring patterns 3, is covered with the etching resist, first. Then, the metal supporting layer 1 is etched by using a known etching solution such as ferric chloride solution and, thereafter, the etching resist is removed.

The slit groove S thus formed, has a width of 20–200 μm, or preferably 50–150 μm. When the width of the slit groove S is smaller than this, an end surface of the metal supporting layer 1 may contact with each other at the splitting process to incur deformation of the end surface of the slit groove S. On the other hand, when the width of the slit groove S is larger than this, the slit groove S may be undulated at the end surface thereof to incur deterioration of the accuracy of the splitting process.

The continuous sheet 10 thus formed (the sheet in which the TAB tape carriers to be split into individual lines (strips) are continuously formed in parallel) has the mounting regions R for mounting the electronic devices. The mounting regions R are arranged in series in each of the lines L which are arranged adjacent to each other in the widthwise direction of the elongate metal supporting layer 1 and spaced apart from each other at a predetermined distance along the longitudinal direction of the metal supporting layer 1, as shown in FIG. 3(a). It also has the slit grooves S which are formed between the lines L and arranged between the lines of the feed holes 5 arranged adjacent to each other along the longitudinal direction of the metal supporting layer 1.

Each of the mounting regions R has, in its center portion, a generally rectangular surface to mount (place) the electronic device (not shown), serving as a generally rectangular mounting portion 11, as shown in FIG. 3(b). Also, each of the wiring patterns 3 comprises a plurality of wirings 8 which are provided in four surrounding sides of the rectangular mounting portion 11 to extend between an inside of the mounting portion 11 and an outside of the same. The wirings 8 are arranged in substantially parallel relation with each other and spaced apart from each other at a predetermined distance in each of the four sides of the rectangular mounting portion 11. A pitch of the wirings 8 at the inside of the mounting portions 11 (a total length of a width of one wiring 8 and a width (distance) between the one wiring 8 and an adjacent wiring 8) is set to be in the range, for example, from 60 μm or less, or preferably 40 μm or less, to usually 10 μm or more. This pitch can allow realization of the high density wiring.

The solder resist 7 is formed in the form of a generally rectangular frame to surround the mounting portion 11, so as to cover the intermediate portions of the wirings 8. The wirings 8 are covered with the nickel plated layer and gold plated layer at the both ends thereof exposed from the solder resist 7.

The metal supporting layer 1 is opened at locations corresponding to the mounting regions R, to form generally rectangular openings 9 at the back side of the mounting regions R.

Then, the continuous sheet 10 is divided into individual lines of the sheet by splitting the insulating layer 2 along the slit grooves S, thereby producing a TAB tape carrier 12, as shown in FIG. 2(k).

No particular limitation is imposed on means for splitting the insulating layer 2 along the slit grooves S. For example, a nip roll 22 comprising two opposite arranged rolls can be used to pull the continuous sheet 10 in the opposite directions to each other and in the perpendicular direction to a feeding direction of the nip roll 22 along the slit grooves S as boundaries at a location downstream of the feeding direction of the nip roll 22, as shown in FIG. 4.

Specifically, the continuous sheet 10 is fed horizontally from the nip roll 22 and then is pulled in vertical directions orthogonal to the feeding direction of the nip roll 22 so that adjacent strips (lines) of the sheet 10 can be pulled in the opposite directions to each other. This can force the continuous sheet 10 to be split vertically along the slit grooves S in each of the lines of the sheet, so that the continuous sheet 10 is divided into the individual strips of the sheet to thereby produce the TAB tape carrier 12 continuously.

Though not shown in FIG. 4, a plurality of winding rolls are alternately arranged at downstream of the nip roll 22 and at vertical positions orthogonal to the feeding direction of the nip roll 22, to correspond to the alternate strips of the sheet 10. These winding rolls allow the alternate strips of the continuous sheet 10 to be pulled and taken up directly thereon.

In this method, since the insulating layer 2 is split along the slit grooves S formed in the metal supporting layer 1 to divide the continuous sheet into the individual strips, the TAB tape carrier 12 produced in this method can be prevented from being undulated at the split end surfaces and the circuit pattern 3 can be prevented from being torn thereat even when the circuit pattern 3 is formed to be small in thickness.

Also, since the insulating layer 2 is formed directly on the metal supporting layer 1 and the wiring pattern 3 is formed directly on the insulating layer 2, without using any adhesive, the TAB tape carrier is not bound by the limitations on heat-resistance temperature and on chemical resistance caused by the adhesive. This can allow the TAB tape carrier to have sufficient heat resistance in the production process or in the mounting process of the electronic devices, thus preventing deterioration in reliability caused by the adhesive. Thus, this method of producing the TAB tape carrier 12 can be effectively used, for example, in the application to a circuit requiring a thin film and a fine wiring pattern such as COF (chip on film).

In FIGS. 3 and 4, there is illustrated the embodiment in which four lines (four strips) of TAB tape carriers 12 are simultaneously formed in the metal supporting layer 1 along the widthwise direction thereof. In practice, for example when a stainless foil having a width of 250 mm is used as the metal supporting layer 1, four lines of TAB tape carriers 12, each having a width of 48 mm, can be formed simultaneously. When a stainless foil having a width of 300 mm is used as the metal supporting layer 1, four lines of TAB tape carriers 12, each having a width of 70 mm, can be formed simultaneously.

In the method of producing the TAB tape carrier of the present invention, the number of lines of the TAB tape carriers formed can be properly selected in accordance with its intended purpose and application, without limiting to the four lines.

Also, in the method described above, the respective processes recited above, i.e., the process of forming the insulating layer 2 directly on the elongate metal supporting layer 1, the process of forming the ground layer 4 on the entire surface of the insulating layer 2, the process of forming the feed holes 5 to extend through the metal supporting layer 1, the insulating layer 2, and the ground layer 4 in the thickness direction thereof, the process of forming the plating resist 6 of the reversal pattern to the lines of wiring patterns 3 on the ground layer 4, the process of forming the lines of wiring patterns 3 by electrolytic plating on the ground layer 4 at locations where the plating resist 6 is not formed, the process of removing the plating resist 6, the process of removing the portions of the ground layer 4 where the plating resist 6 was formed, the process of forming the solder resist 7 to cover the intermediate portions of the wirings 8 in the each wiring pattern 3, the process of forming the openings 9 in the metal supporting layer 1 at the portions thereof corresponding to the mounting regions R and also forming the slit grooves S between the adjacent lines L where the wiring patterns 3 are formed, and the process of splitting the insulating layer 2 along the slit grooves S to divide the continuous sheet 10 into the individual strips of sheet 10, thereby producing the TAB tape carriers 12, can be carried out continuously by the roll-to-roll process using the feeding roll at the feeding side and the winding roll at the winding side disposed opposite to each other at a predetermined distance.

EXAMPLES

While in the following, the present invention will be described in further detail with reference to Example, the present invention is not limited to any of the example.

Example 1

A metal supporting layer of SUS304 having thickness of 20 $\mu$m and width of 250 mm was prepared (Cf. FIG. 1(a)). Then, polyamide acid resin solution made by polymerization with N-methylpyrrolidone as a solvent was applied to the metal supporting layer by casting with a use of a comma roll coaters and then was dried while the temperature was gradually changed to 120–160° C. After the temperature was allowed to gradually rise further to 200–400° C., the metal supporting layer was held at 400° C. for one hour to cure the resin, thereby producing the insulating layer of polyimide resin on the metal supporting layer. The insulating layer was formed to have thickness of 12 $\mu$m by adjusting a coater gap of the comma roll coaters (Cf. FIG. 1(b)).

Sequentially, a plurality of lines of wiring patterns were formed on the insulating layer by the semi-additive process. Specifically, a thin chromium film having thickness of 300 Å and a thin copper film having thickness of 700 Å were formed as a ground layer on the insulating layer by sputtering (Cf. FIG. 1(c)).

Thereafter, a number of feed holes are formed along the longitudinal direction of the lines by punching at locations corresponding to both widthwise ends of each of the lines of the wiring patterns formed in lines, to extend through the metal supporting layer, the insulating layer, and the ground layer in the thickness direction thereof (Cf. FIG. 1(d)). Then, a plating resist having a reversal pattern to the lines of wiring patterns was formed (Cf. FIG. 1(e)). The plating resist was formed in the following manner: After photosensitive dry film resists were laminated on the ground layer and the back side of the metal supporting layer, respectively, by use of a vacuum laminator, the photosensitive dry film resists were exposed to light through a glass mask having a predetermined pattern and then were developed in an approximately 1 weight % sodium carbonate aqueous solution to form the reversal pattern to the lines of the wiring patterns.

Sequentially, the wiring pattern having a thickness of 10 $\mu$m was formed on the ground layer at the portions thereof exposed from the plating resist by electrolytic copper plating (Cf. FIG. 1(f)). Thereafter, the plating resist was peeled off (Cf. FIG. 2(g)). The portions of the ground layer where the plating resist was formed were removed by etching the thin chromium film by using hydrogen peroxide/sulfate solution and etching the thin copper film by using potassium ferricyanide solution (Cf. FIG. 2(h)).

As a result of this, the wiring patterns were formed on the insulating layer in each of four lines (four strips) spaced apart from each other in a widthwise direction of the metal supporting layer. The wiring patterns in each of the four lines were respectively formed in generally rectangular electronic-device-mounting regions spaced apart from each other at a predetermined distance in a longitudinal direction of the metal supporting layer.

Sequentially, a photosensitive solder resist having thickness of the order of 15 $\mu$m was formed to cover intermediate portions of the wirings in each of the wiring patterns by a screen printing method (Cf. FIG. 2(i)).

Also, an electrolytic nickel plating and an electrolytic gold plating were carried out in sequence, so that a nickel plated layer having thickness of 2 $\mu$m and a gold plated layer having thickness of 0.5 $\mu$m were formed at both ends of the wirings exposed from the solder resist.

Thereafter, the thus produced continuous sheet was covered with a photosensitive dry film resist by using a vacuum laminator at its portions on the circuit pattern side and on the metal supporting layer side. Then, the photosensitive dry film resist was exposed to light and developed, to expose the metal supporting layer at the opening forming portions thereof corresponding to the mounting regions and at the slit groove forming portions thereof between the lines extending in the longitudinal direction thereof. Thereafter, the exposed portions of the metal supporting layer were etched by using ferric chloride solution (Cf. FIG. 2(j)). As a result of this, the openings were formed in the metal supporting layer at locations corresponding to the mounting regions and also the slit grooves having width of 100 $\mu$m were formed between the adjacent lines of wiring patterns.

Sequentially, after the continuous sheet was fed out from the nip roll, adjacent lines of the continuous sheet were wound up in the tensed state in the opposite direction to each other by the winding rolls located at downstream of the nip roll, so that the continuous sheet was split vertically along the slit grooves to thereby produce four strips of TAB tape carriers (Cf. FIG. 2(k)).

It was confirmed that no undulation was formed at the split end surfaces of each of the TAB tape carriers and no tear of the circuit pattern was formed thereat.

While the illustrative embodiments of the present invention are provided in the above description, such is for illustrative purpose only and it is not to be construed restrictively. Modification and variation of the present invention that will be obvious to those skilled in the art is to be covered by the following claims.

What is claimed is:

1. A method of producing a TAB tape carrier comprising:
    forming an insulating layer directly on an elongate metal supporting layer,
    forming a plurality of lines of wiring patterns directly on the insulating layer,
    forming a slit groove in the metal supporting layer in a space between adjacent lines of the wiring patterns, and
    splitting the insulating layer along the slit groove to divide the plurality of lines of wiring patterns into each individual line of wiring patterns.

2. The method of producing the TAB tape carrier according to claim 1, wherein the metal supporting layer is a stainless foil.

* * * * *